(12) United States Patent
Ahn

(10) Patent No.: US 8,368,047 B2
(45) Date of Patent: Feb. 5, 2013

(54) SEMICONDUCTOR DEVICE

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 123 days.

(21) Appl. No.: 12/606,880

(22) Filed: Oct. 27, 2009

(65) Prior Publication Data

US 2011/0095309 A1    Apr. 28, 2011

(51) Int. Cl.
*H01L 29/06* (2006.01)

(52) U.S. Cl. .................................. 257/13; 257/79

(58) Field of Classification Search .................. 257/13, 257/14, 79, 96
See application file for complete search history.

(56) References Cited

U.S. PATENT DOCUMENTS

| | | |
|---|---|---|
| 3,990,096 A | 11/1976 | Namizaki et al. |
| 4,764,261 A | 8/1988 | Ondris et al. |
| 5,079,774 A | 1/1992 | Mendez et al. |
| 5,112,410 A | 5/1992 | Chen |
| 5,175,739 A | 12/1992 | Takeuchi et al. |
| 5,181,219 A | 1/1993 | Mori et al. |
| 5,181,221 A | 1/1993 | Mori et al. |
| 5,182,757 A | 1/1993 | Mori et al. |
| 5,287,377 A | 2/1994 | Fukuzawa et al. |
| 5,291,507 A | 3/1994 | Haase et al. |
| 5,295,148 A | 3/1994 | Mori et al. |
| 5,317,584 A | 5/1994 | Mori et al. |
| 5,404,027 A | 4/1995 | Haase et al. |
| 5,404,369 A | 4/1995 | Mori et al. |
| 5,490,953 A | 2/1996 | Morita |
| 5,606,176 A | 2/1997 | Nitta |
| 5,646,419 A | 7/1997 | McCaldin et al. |
| 5,818,072 A | 10/1998 | Schetzina |
| 5,933,444 A | 8/1999 | Molva et al. |
| 6,069,380 A | 5/2000 | Chou et al. |
| 6,515,313 B1 | 2/2003 | Ibbetson et al. |
| 6,627,914 B1 | 9/2003 | Komiyama et al. |
| 6,803,596 B2 | 10/2004 | Hata |
| 6,813,063 B2 | 11/2004 | Ishihara |
| 6,891,329 B2 | 5/2005 | Nagano et al. |
| 7,420,225 B1 | 9/2008 | Wanke et al. |
| 7,638,817 B2 | 12/2009 | Shur et al. |
| 2002/0031153 A1 | 3/2002 | Niwa et al. |
| 2002/0150135 A1 | 10/2002 | Naone et al. |

(Continued)

FOREIGN PATENT DOCUMENTS

| | | |
|---|---|---|
| JP | 09199783 | 7/1997 |
| JP | 07202340 | 8/2007 |

(Continued)

OTHER PUBLICATIONS

U.S. Appl. No. 12/472,168, Mail Date Jun. 18, 2010, Office Action.

(Continued)

*Primary Examiner* — Mark Prenty
(74) *Attorney, Agent, or Firm* — Workman Nydegger

(57) ABSTRACT

Semiconductor devices including a light emitting layer, and at least one surface plasmon metal layer in contact with the light emitting layer are provided. The light emitting layer includes an active layer having a first band gap, and one or more barrier layers having a second band gap. The first band gap is smaller than the second band gap. Methods for fabricating semiconductor devices are also provided.

21 Claims, 9 Drawing Sheets

U.S. PATENT DOCUMENTS

| | | | |
|---|---|---|---|
| 2004/0058467 A1 | 3/2004 | Chirovsky et al. | |
| 2004/0095978 A1 | 5/2004 | Cheng et al. | |
| 2004/0183087 A1 | 9/2004 | Gardner | |
| 2004/0232412 A1 | 11/2004 | Burgener, II et al. | |
| 2005/0074576 A1 | 4/2005 | Chaiken et al. | |
| 2005/0185686 A1 | 8/2005 | Rupasov et al. | |
| 2005/0285128 A1 | 12/2005 | Scherer et al. | |
| 2006/0244003 A1 | 11/2006 | Ueda | |
| 2007/0063304 A1 | 3/2007 | Matsumoto et al. | |
| 2007/0126021 A1 | 6/2007 | Ryu et al. | |
| 2007/0126037 A1 | 6/2007 | Ikeda | |
| 2007/0194297 A1 | 8/2007 | McCarthy et al. | |
| 2007/0298551 A1 | 12/2007 | Bouvet et al. | |
| 2008/0048193 A1 | 2/2008 | Yoo et al. | |
| 2008/0197366 A1 | 8/2008 | Yoo et al. | |
| 2009/0017268 A1 | 1/2009 | Skipor et al. | |
| 2009/0020149 A1 | 1/2009 | Woods et al. | |
| 2009/0114940 A1 | 5/2009 | Yang et al. | |
| 2009/0121628 A1 | 5/2009 | Cho et al. | |
| 2009/0273820 A1 | 11/2009 | Dionne et al. | |
| 2009/0310640 A1 | 12/2009 | Sato et al. | |
| 2010/0096001 A1 | 4/2010 | Sivananthan et al. | |
| 2010/0155696 A1 | 6/2010 | Duan et al. | |
| 2010/0261338 A1 | 10/2010 | Tsakalakos et al. | |
| 2010/0276661 A1 | 11/2010 | Ahn | |
| 2010/0301308 A1 | 12/2010 | Ahn | |
| 2010/0301454 A1 | 12/2010 | Zhang et al. | |
| 2010/0326489 A1 | 12/2010 | Ahn | |
| 2011/0001121 A1 | 1/2011 | Ahn | |
| 2011/0001122 A1 | 1/2011 | Ahn | |
| 2011/0001124 A1 | 1/2011 | Ahn | |
| 2011/0001125 A1 | 1/2011 | Ahn | |
| 2011/0043884 A1 | 2/2011 | Ahn | |
| 2011/0095309 A1* | 4/2011 | Ahn | 257/86 |
| 2011/0114995 A1 | 5/2011 | Ahn | |
| 2012/0040483 A1 | 2/2012 | Ahn | |

FOREIGN PATENT DOCUMENTS

| | | |
|---|---|---|
| WO | WO 2009067347 | 5/2009 |
| WO | WO 2009106583 | 9/2009 |
| WO | WO 2010137865 | 12/2010 |
| WO | WO 2011004990 | 1/2011 |

OTHER PUBLICATIONS

U.S. Appl. No. 12/472,168, Mail Date Jan. 5, 2011, Office Action.
U.S. Appl. No. 12/472,168, Mail Date Feb. 22, 2011, Notice of Allowance.
U.S. Appl. No. 12/498,228, Mail Date Sep. 1, 2010, Office Action.
U.S. Appl. No. 12/498,228, Mail Date Dec. 23, 2010, Office Action.
E. H. Sargent, et al "Lateral Injection Lasers" International Journal of High Speed Electronics and Systems, Dec. 1998, vol. 9, No. 4, pp. 941-978.
S. Bai, et al "Determination of the electric field in 4H/3C/4H—SiC quantum wells due to spontaneous polarization in the 4H SiC matrix" Appl. Phys. Lett. 83, 3171 (Oct. 2003).
D-M. Yeh, et al "Surface plasmon coupling effect in an InGaN/GaN single-quantum-well light-emitting diode" Appl. Phys. Lett. 91, 171103 (2007).
Australian Patent Office; International Search Report and Written Opinion in corresponding PCT application (PCT/KR2010/007292): mailed Jan. 26, 2011.
R. Paschotta "Encyclopedia of Laser Physics and Technology, vol. 1", Wiley-VCH, 2008, ISBN 3527408282, 9783527408283 p. 595, 2008.
Hetterich J., et al, Optimized Design of Plasmonic MSM Photodetector, IEEE Journal of Quantum Electronics, Oct. 2007, vol. 43, No. 10, pp. 855 to 859.
Taguchi, T., et al., Ultraviolet Laser and Photodetector of CdZnS/ZnS Multiple Quantum Wells, Physica B. 1993, vol. 191, pp. 136 to 139, 1993.
Yu, E. T., et al., Plasmonic Nanoparticle Scattering for Enhanced Performance of Photovoltaic and Photodetector Devices, Proceedings of SPIE, Aug. 28, 2008, vol. 7033, Plasmonics: Nanoimaging, Nanofabrication and their Applications IV, pp. 70331V-1 to 70331V-9.
Sumith, B. et al., Quantum Well Infrared Photodetectors for Long Wavelength Infrared Applications, Proceedings of SPIE, Oct. 1998, vol. 3436, Infrared Technology and Applications XXIV, pp. 280 to 284.
International Search Report and Written Opinion, mailed Aug. 10, 2010, as issued in connection with Patent Application No. PCT/KR2010/003322, filed on May 26, 2010.
International Search Report and Written Opinion, mailed Sep. 10, 2010, as issued in connection with Patent Application No. PCT/KR2010/004350, filed on Jul. 5, 2010.
U.S. Appl. No. 12/472,168, Mail Date Jul. 21, 2010, Office Action.
Seoung-Hwan Park, et al "Many-body optical gain of wurtzite GaN-based quantum-well lasers and comparison with experiment" Appl. Phys. Lett. 72 (3), Jan. 19, 1998, pp. 287-289.
Seoung-Hwan Park, et al "Piezoelectric effects on electrical and optical properties of wurtzite GaN/AlGaN quantum well lasers" Applied Physics Letters vol. 72, No. 24, Jun. 15, 1998, pp. 3103-3105.
Seoung-Hwan Park, et al "Many-body optical gain and intraband relaxation time of wurtzite InGaN/GaN quantum-well lasers and comparison with experiment" Applied Physics Letters 87, 044103 (2005).
Seoung-Hwan Park, et al "Optical gain in InGaN/InGaAlN quantum well structures with zero internal field" Applied Physics Letters 92, 171115 (2008).
Jie Liu, et al "AlGaN/GaN/InGaN/GaN DH-HEMTs With an InGaN Notch for Enhanced Carrier Confinement" IEEE Electron Device Letters, vol. 27, No. 1, Jan. 2006, pp. 10-12.
Doyeol Ahn "Theory of Non-Markovian Gain in Strained-Layer Quantum-Well Lasers with Many-Body Effects" IEEE Journal of Quantum Electronics, vol. 34, No. 2, Feb. 1998, pp. 344-352.
Doyeol Ahn, et al "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.
Yifei Zhang, et al "Charge control and mobility studies for an AiGan/GaN high electron mobility transistor" Journal of Applied Physics, vol. 85, No. 1, Jan. 1, 1999, pp. 587-594.
Tsung-Hsing Yu, et al "Theoretical study of the two-dimensional electron mobility in strained III-nitride heterostructures" Journal of Applied Physics, vol. 89, No. 7, Apr. 1, 2001, pp. 3827-3834.
D. Ahn, et al "Electric field dependence of instrasubband polar-optical-phonon scattering in a quantum well" Physical Review B, vol. 37, No. 5, Feb. 15, 1988-I, pp. 2529-2535.
Doyeol Ahn "Time-convolutionless reduced-desnsity-operator theory of an arbitrary driven system coupled to a stochastic reservoir: Quantum kinetic equations for semiconductors" Physical Review B, vol. 50, No. 12, Sep. 15, 1994-II, pp. 8310-8318.
Doyeol Ahn "Time-convolutionless reduced-desnsity-operator theory of an arbitrary driven system coupled to a stochastic reservoir. II. Optical gain and line-shape function of a driven semiconductor" Physical Review B, vol. 51, No. 4, Jan. 15, 1995-II, pp. 2159-2166.
A. Jia, et al "Design of new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090, 2000.
J. Ueno, et al "MBE growth of ZnSe/MgCdS and ZnCdS/MgCdS superlatttices for UV-A sensors" Phys. Stat. Sol. (c), 2006.
Seoung-Hwan Park, et al "Crystal-orientation effects on the piezo-electric field and electronic properties of strained wurtzite semiconductors" Physical Review B, vol. 59, No. 7, Feb. 15, 1999-I, pp. 4725-4737.
Sergey I. Bozhevolnyi, et al "Channel Plasmon-Polariton Guiding by Subwavelength Metal Grooves" Physical Review Letters, vol. 95, 046802, Jul. 22, 2005, pp. 046802-1-046802-4.
K. Leosson, et al "Long-range surface plasmon polariton nanowire waveguides for device applications" Optics Express, vol. 14, No. 1, Jan. 9, 2006 pp. 314-319.
Liu Liu, et al "Novel surface plasmon waveguide for high integration" Optics Express, vol. 13, No. 17, Aug. 22, 2005 pp. 6645-6650.
Arup Neogi, et al "Enhancement of spontaneous recombination rate in a quantum well by resonant surface plasmon coupling" Physical Review B, vol. 66 (2002) pp. 153305-1-153305-4.

Koichi Okamoto, et al "Surface-plasmon-enhanced light emitters based on InGaN quantum wells" Nature Materials, vol. 3, Sep. 2004, pp. 601-605.

Seoung-Hwan Park, et al., "Spontaneous and piezoelectric polarization effects in wurtzite ZnO/MgZnO quantum well lasers", Appl. Phys. Lett.87, Dec. 15, 2005, 253509-1-253509-3, American Institute of Physics.

D.Ahn, et al., "Optical Gain and Luminescence of a ZnO—MgZnO Quantum Well", IEEE Photonices Technology Letters, vol. 18, Jan. 15, 2006, 349-351, IEEE.

P.I.Kuznetsov, et al., "Hexagonal ZnCdS epilayers and CdSSe/ZnCdS QW structures on CdS(0001) and ZnCdS(0001) substrates grown by MOVPE", Physica E 17, 2003, 516-517, Elsevier Science B.V.

Chul Huh, et al., "Improvement in light-output efficiency of InGaN/GaN multiple-quantum well light-emitting diodes by current blocking layer", Appl. Phys., vol. 92, No. 5, Sep. 1, 2002, 2248-2250, American Institute of Physics.

Seong-Ran Jeon, et al., "GaN tunnel junction as a current aperture in a blue surface-emitting light-emitting diode", Appl. Phys. Lett., vol. 80, No. 11, Mar. 18, 2002, 1933-1935, American Institute of Physics.

Seoung-Hwan Park, et al., "Crystal-orientation effects on the piezoelectric field and electronic properties of strained wurtzite semiconductors", vol. 59, No. 7, Feb. 15, 1999, 4725-4737, The American Physical Society.

Seoung-Hwan Park, "Crystal Orientation Effects in Electronic Properties of Wurtzite GaN/AIGaN Quantum Wells with Spontaneous and Piezoelectric Polarization", Jpn. J. Appl. Phys. vol. 39, Part 1, No. 6A, Jun. 2000, 3478-3482, The Japan Society of Applied Physics.

P. Walterelt, et al., Nitride semiconductors free of electrostatic fields for efficient white light-emitting diodes, Nature, vol. 406, Aug. 24, 2000, 865-868, Macmillan Magazines Ltd.

D. Ahn, et al., "A field-effect quantum-well laser with lateral current injection", J.Appl. Phys. 64(1), Jul. 1, 1988, 440-442, American Institute of Physics.

Hyunsoo Kim, et al., "Lateral current transport path, a model for GaN-based light-emitting diodes: application to practical device designs", Appl. Phys. Lett., vol. 81, No. 7, Aug. 12, 2002, 1326-1328, American Institute of Physics.

Seong-Ran Jeon, et al., "Lateral current spreading in GaN-based light-emitting diodes utilizing tunnel contact junctions", Appl. Phys. Lett., vol. 78, No. 21, May 21, 2001, 3265-3267, American Institute of Physics.

I.V. Bradley, et al., "Space-charge effects in type-II strained layer superlattices", Journal of Crystal Growth, 184/185, 1998, 728-731, Elsevier Science 1998.

U.S. Appl. No. 12/498,228, filed Jul. 12, 2011, Office Action.
U.S. Appl. No. 12/498,204, filed Jul. 21, 2011, Notice of Allowance.
U.S. Appl. No. 12/498,265, filed May 17, 2011, Office Action.
U.S. Appl. No. 12/498,204, filed Apr. 26, 2011, Office Action.

Al-Salim, Najeh, Synthesis of CdSeS Nanocrystals in Coordinating and Noncoordinating Solvents: Solvent's Role in Evolution of the Optical and Structural Properties, Mar. 26, 2007.

B. Ullrich, Semiconductor Science and Technology "Green emission and bandgap narrowing due to two-photon excitation in thin film CdS formed by spray pyrolysis", published Jun. 22, 2011.

Siliconfareast.com; "Lattice Constants"; http://www.siliconfareast.com/lattice_constants.htm; 2 pages; retrieved Oct. 7, 2011.

Wikipedia; "Wurtzite crystal structure", http://en.wikipedia.org/wiki/Wurtzite_crystal_structure; 1 page; retrieved Oct. 7, 2011.

U.S. Appl. No. 12/472,168, Aug. 18, 2011, Notice of Allowance.
U.S. Appl. No. 12/472,168, Sep. 1, 2011, Notice of Allowance.
U.S. Appl. No. 12/498,265, Aug. 26, 2011, Office Action.
U.S. Appl. No. 12/498,204, Jul. 28, 2011, Notice of Allowance.
U.S. Appl. No. 12/498,204, Oct. 25, 2011, Notice of Allowance.
U.S. Appl. No. 12/498,228, Dec. 15, 2011, Notice of Allowance.
U.S. Appl. No. 12/498,204, Feb. 1, 2012, Office Action.
U.S. Appl. No. 12/498,257, Nov. 23, 2011, Office Action.

Alda, Javier et al., "Optical antennas for nano-photonic applications," vol. 16, No. 5, Trends on Nanothecnology. TNT2004. Phantoms Foundations. Segovia (Spain). Sep. 13-17, 2004, http://www.iop.org/EJ/abstract/0957-4484/16/5/017.

Hoang, T. et al., "A high efficiency lateral light emitting device on SOI," Electron Devices for Microwave and Optoelectronic Applications, EDMO 2004, 12th International Symposium, Nov. 8-9, 2004, pp. 87-91.

LEDs Magazine, "Goldeneye sets brightness benchmark for green LEDs", http://www.ledsmagazine.com/news/5/5/18, May 15, 2008, 2 pages.

Smith S.J. et al., "Lateral light emitting n-i-p diodes in InSb/Al x ln1—xSb quantum wells," Applied Physics Letters, vol. 89, p. 111118 (2006), 3 pages, Sep. 2006.

"II-VI solar cells moving to the production phase," Photovoltaics Bulletin., (2003), vol. 2003, No. 11, Oct. 2003, pp. 10-12.

Andreani, Lucio Claudio, et al, Exchange interaction and polariton effects in quantum-well excitons, Physical Review B, vol. 41, No. 11, pp. 7536-7544 (1990).

Angelakis, D. G., et al., "Photon-blockade-induced Mott transitions and XY spin models in coupled cavity arrays," Phys. Rev. A76, 031805 (2007).

Chu, T.L., and Chu, S.S., "Thin film II-VI photovoltaics," vol. 38, Issue 3, Mar. 1995, pp. 533-549.

Compaan, A. D., et al., "Sputtered II-VI Alloys and Structures for Tandem PV," Subcontract Report NREL/SR-520-43954, Sep. 2008, pp. 64.

Gogolin, O., et al., Temperature dependence of exciton peak energies in Cui quantum dots, Solid State Communications, vol. 122, pp. 511-513 (2002).

Goosen, K.W., "Excitonic electroabsorption in extremely shallow quantum wells," Appl. Phys. Lett., vol. 57, Issue 24, pp. 2582-2584, Dec. 1990.

Greentree, A.D., et al., "Quantum phase transitions of light," Nature Physics 2, pp. 856-861 (2006).

Hartmann, M.J., and Plenio, M.B., "Strong Photon Nonlinearities and Photonic Mott Insulators," Physical Review Letters, vol. 99, Issue 10, Sep. 7, 2007, pp. 103601-1 to 103601-4.

Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).

Klimov, V.I., et al., "Optical Gain and Stimulated Emission in Nanocrystal Quantum Dots," Science, Oct. 13, 2000, vol. 290, No. 5490, pp. 314-317.

Little, R. B., et al., "Formation of quantum-dot quantum-well heteronanostructures with large lattice mismatch: ZnS/CdS/ZnS" Journal of Chemical Physics, vol. 114, No. 4, 2001, pp. 1813-1822.

Masumoto, Y., et al., "Observation of persistent spectral hole burning in CuBr quantum dots," Physical Review B, vol. 52, No. 7, pp. 4688-4691 (1995).

Obloh, H., "Group III-nitride based blue emitters," Advances in Solid State Physics, vol. 38, 15-28 (1999).

Park, S.-H., et al., "Internal field engineering in CdZnO/MgZnO quantum well structures," Applied Physics Letters, vol. 94, Issue:8, pp: 083507, 1-3 (2009).

Ricker, T., "Samsung's "world's smallest" 8.4 megapixel CMOS sensor: so long CCD?," accessed at http://www.engadget.com/2007/03/27/samsungs-worlds-smallest-8-4-megapixelcmos-sensor-so-long/, Mar. 27, 2007, pp. 4.

Tassone, F., et al, "Quantum-well reflectivity and exciton-polariton dispersion," Physical Review B, vol. 45, No. 11, pp. 6023-6030 (1992).

Valenta, J., et al., "Hole-filling of persistent spectral holes in the excitonic absorption band of CuBr quantum dots," Applied Physics Letters, vol. 70, No. 6, pp. 680-682 (1997).

Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).

Hernández, F. E. et al., "High Performance Optical Limiter," accessed at http://web.archive.org/web/20050429144449/http://www.ieee.org/organizations/pubs/ newsletters/leos/dec00/high.htm, accessed on May 7, 2012, pp. 5.

Shakya, J., et al., "Switching characteristics of III-Nitride blue/green micro-LEDs," The Smithsonian/NASA Astrophysics Data System, American Physical Society, Annual March Meeting, Mar. 12-16, 2001.

S. X. Jin, et al., "Size dependence of III-nitride microdisk light-emitting diode characteristics," Applied Physics Letters, May 28, 2001, vol. 78, No. 22, pp. 3532-3534.
International Search Report and Written Opinion for International Application No. PCT/KR2010/002649 mailed on Jul. 26, 2010.
International Search Report and Written Opinion for International Application No. PCT/KR2010/005600 mailed on Oct. 22, 2010.
International Search Report and Written Opinion for International Application No. PCT/KR2010/008118 mailed on Feb. 11, 2011.
U.S. Appl. No. 12/472,168, Mar. 29, 2012, Notice of Allowance.
U.S. Appl. No. 12/498,265, Feb. 28, 2012, Office Action.
U.S. Appl. No. 12/498,204, Mar. 26, 2012, Notice of Allowance.
U.S. Appl. No. 13/485,241, filed May 31, 2012, Ahn.
U.S. Appl. No. 12/472,168, May 29, 2012, Notice of Allowance.
U.S. Appl. No. 12/498,204, May 29, 2012, Notice of Allowance.
U.S. Appl. No. 12/498,265, Aug. 17, 2012, Office Action.
U.S. Appl. No. 12/498,204, Jul. 4, 2012, Issue Notification.
U.S. Appl. No. 12/498,257, Jul. 3, 2012, Office Action.
U.S. Appl. No. 12/493,800, Jan. 20, 2012, Office Action.
U.S. Appl. No. 12/493,800, Apr. 26, 2012, Office Action.
U.S. Appl. No. 12/545,678, Dec. 16, 2011, Office Action.
U.S. Appl. No. 12/545,678, Jun. 20, 2012, Notice of Allowance.

* cited by examiner

SEMICONDUCTOR DEVICE

CROSS REFERENCE TO RELATED APPLICATION

This application is related to U.S. Patent application 12/498,265 filed Jul. 6, 2009 and to U.S. Patent application 12/498,257 filed Jul. 6, 2009 and to U.S. Patent application 12/498,204filed Jul. 6, 2009 and to U.S. Patent application 12/472,168 filed May 26, 2009.

BACKGROUND

Nano-photonics or nano-optics is the study of the behavior of light on the nanometer scale. Near-field scanning optical microscopy (NSOM), photoassisted scanning tunnelling microscopy, and surface plasmon optics are examples of nano-optics technologies.

Recently nano-photonic semiconductor devices have been developed to have smaller dimensions than the wavelength of the lights emitted from the devices. Nano-photonic semiconductor devices may be used in various kinds of optoelectronic devices. There is current interest in improving the properties of optical confinement of nano-photonic semiconductor devices.

SUMMARY

In one embodiment, a semiconductor device includes a light emitting layer, and at least one surface plasmon metal layer in contact with the light emitting layer. The light emitting layer includes an active layer having a first band gap, and one or more barrier layers disposed on at least one surface of the active layer. The barrier layers have a second band gap. The first band gap is smaller than the second band gap.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
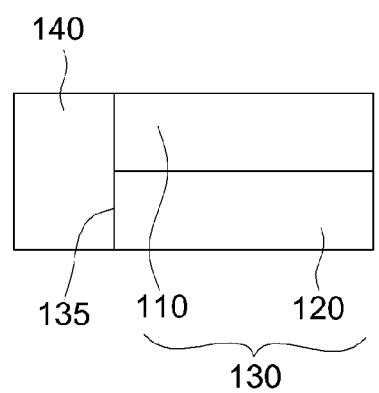
FIG. 1 is a schematic diagram of an illustrative embodiment of a semiconductor device.

In one embodiment, a semiconductor device includes a light emitting layer, and at least one surface plasmon metal layer in contact with the light emitting layer. The light emitting layer includes an active layer having a first band gap, and one or more barrier layers disposed on at least one surface of the active layer. The barrier layers have a second band gap. The first band gap is smaller than the second band gap.

Each of the active layer and the one or more barrier layers may be composed of a IV group semiconductor material, a IV-IV group compound semiconductor material, a III-V group compound semiconductor material, a II-VI group compound semiconductor material, or a I-VII group compound semiconductor material.

Permittivity of the at least one surface plasmon metal layer may be greater than permittivity of the active layer and the one or more barrier layers. The at least one surface plasmon metal layer may include Au, Ag, Cu, or an alloy thereof.

The semiconductor device may further include a first doped layer disposed on one lateral surface of the light emitting layer, and a second doped layer disposed on the other lateral surface of the light emitting layer. The at least one surface plasmon metal layer may be disposed on an upper surface of the light emitting layer. The semiconductor device may further include a first electrode disposed on one surface of the first doped layer, and a second electrode disposed on one surface of the second doped layer.

The semiconductor device may further include a gate electrode, disposed on the upper surface of the light emitting layer and spaced from the at least one surface plasmon metal layer, to apply an electric field to the light emitting layer in order to compensate or cancel out an internal polarization field in the light emitting layer. The gate electrode may be composed of a transparent conductive material.

In another embodiment, the at least one surface plasmon metal layer may be disposed on at least one lateral surface of the light emitting layer. In this embodiment, the semiconductor device may further include a first doped layer and a second doped layer. The first doped layer may include a first portion disposed under both the light emitting layer and the at least one surface plasmon metal layer and a second portion horizontally extended from the first portion. The second doped layer may be disposed on an upper surface of the light emitting layer. The semiconductor device may further include a first electrode partially disposed on the second portion of the first doped layer, and a second electrode disposed on an upper surface of the second doped layer. The first doped layer may be n-type doped layer, and the second doped layer may be p-type doped layer.

The active layer comprises at least one of a quantum wire, a quantum dot, and a nanorod.

In still another embodiment, a short-wavelength light-emitter includes a light emitting layer, at least one surface plasmon metal layer in contact with a first surface of the light emitting layer, a n-type doped layer disposed on a second surface of the light emitting layer, and a p-type doped layer disposed on the a third surface of the light emitting layer. The light emitting layer includes an active layer having a first band gap, and one or more barrier layers disposed on at least one surface of the active layer. The barrier layers have a second band gap. The first band gap is smaller than the second band gap. The second and third surfaces are opposite to each other and the first surface is between the second and third surface.

The short-wavelength light-emitter may further include a gate electrode, disposed on the first surface of the light emitting layer and spaced from the at least one surface plasmon metal layer, to apply an electric field to the light emitting layer in order to compensate or cancel out internal polarization field in the light emitting layer. In one embodiment, the first, second and third surfaces are an upper surface, one lateral surface and the other lateral surface, respectively. In another embodiment, the first, second and third surfaces are a lateral surface, a bottom surface and an upper surface, respectively.

In still another embodiment, a method for fabricating a semiconductor device includes forming an active layer having a first band gap on a substrate, forming one or more barrier layers having a second band gap on at least one surface of the active layer. The active layer and the one or more barrier layers constitute a light emitting layer. The method further includes forming at least one surface plasmon metal layer in contact with the light emitting layer. The first band gap is smaller than the second band gap.

At least one of the active layer and the at least one barrier layer may be formed employing radio-frequency (RF) magnetron sputtering, pulsed laser deposition, metal organic chemical vapor deposition (MOCVD), molecular beam epitaxy, or radio-frequency plasma-excited molecular beam epitaxy.

The method may further include forming a n-type doped layer on one lateral surface of the light emitting layer, and forming a p-type doped layer on the other lateral surface of the light emitting layer. The at least one surface plasmon metal layer is disposed on an upper surface of the light emitting layer. The method may further include forming a gate electrode on the upper surface of the light emitting layer such that the gate electrode is spaced from the at least one surface plasmon metal layer.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 is a schematic diagram of an illustrative embodiment of a semiconductor device. A semiconductor device 100 includes a light emitting layer 130, and at least one surface plasmon metal layer 140. Light emitting layer 130 includes an active layer 110 and at least one barrier layer, for example, a barrier layer 120, disposed on one surface of active layer 110. As depicted in FIG. 1, barrier layer 120 is disposed on a bottom surface of active layer 110. However, in another embodiment, barrier layer 120 may be disposed on an upper surface of active layer.

In still another embodiment, light emitting layer 130 may optionally include additional barrier layer disposed on another surface of active layer 110 facing the surface of active layer 110 on which first barrier layer 120 is disposed. Such embodiment will be described later with respect to FIG. 4. In further embodiment, light emitting layer 130 may include two or more sets of active layer 110 and barrier layer 120 where active layer 110 and barrier layer 120 may be alternatively disposed.

Active layer 110 and barrier layer 120 may have a thickness of several nanometers to several micrometers, respectively. By way of example, the thickness of each of active layer 110 and barrier layer 120 may be about 0.1 nm to 10 μm, about 1 nm to 5 μm, or about 3 nm to 300 nm. Light emitting layer 130 may have a width of several nanometers to several hundreds nanometers. By way of example, the width of light emitting layer 130 may be about 0.1 nm to 10 μm, about 1 nm to 100 nm, or about 5 nm to 50 nm.

Figure 4:
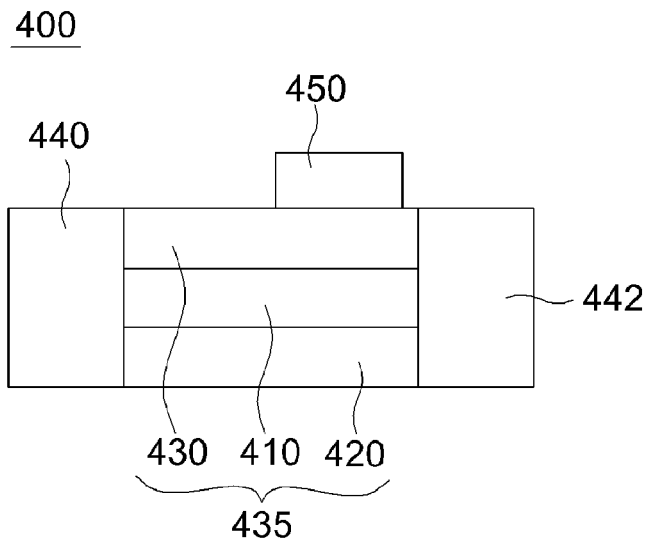
FIG. 4 is a schematic diagram of another illustrative embodiment of a semiconductor device
Figure 5:
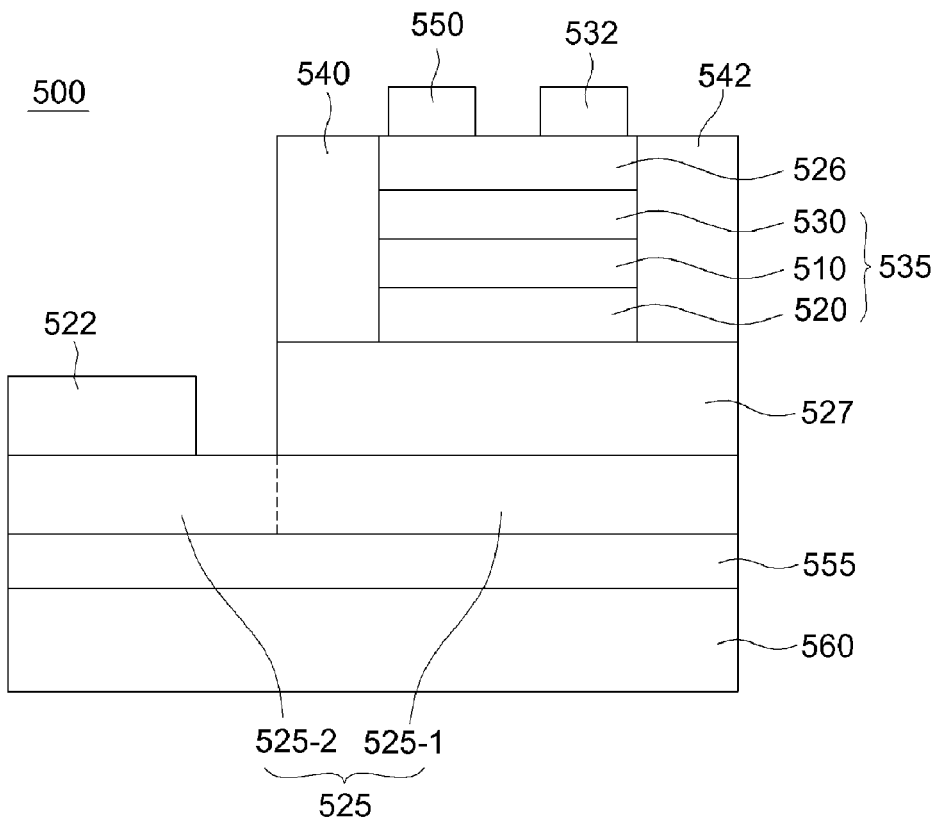
FIG. 5 is a schematic diagram of still another illustrative embodiment of a semiconductor device.

Surface plasmon metal layer 140 may be in contact with light emitting layer 130 such that surface plasmon resonance can occur at an interface 135 between light emitting layer 130 and surface plasmon metal layer 140a. By way of example, FIG. 1 illustrates surface plasmon metal layer 140 disposed on one lateral surface (for example, left lateral surface) of light emitting layer 130. In some embodiments, semiconductor device 100 may optionally include additional surface plasmon metal layer disposed on the other lateral surface (for example, right lateral surface) of light emitting layer 130, as depicted in FIG. 4, which will be described later. In other embodiments, surface plasmon metal layers may be disposed on an upper and/or a bottom surface of light emitting layer 130, as depicted in FIG. 5, which will be described later.

As used herein, the term "surface plasmon resonance" means a collective oscillation of electrons located at the interface between light emitting layer 130 and surface plasmon metal layer 140. The surface plasmon resonance makes a permittivity of surface plasmon metal layer 140 greater than that of light emitting layer 130. This permittivity difference between surface plasmon metal layer 140 and light emitting layer 130 makes an uneven distribution of the optical field generated in light emitting layer 130. The amount of the optical field distributed within light emitting layer 130 becomes greater than the amount of the optical field distributed in surface plasmon metal layer 140. More details on the surface plasmon resonance and the uneven distribution of the optical field will be described later in connection with FIG. 3.

Each of active layer 110 and barrier layer 120 may be composed of a IV group semiconductor material, a IV-IV group compound semiconductor material, a III-V group compound semiconductor material, a II-VI group compound semiconductor material, or a I-VII group compound semiconductor material. By way of examples, IV group semiconductor material may include, without limitation, Si, Ga, In, or Tl. IV-IV group compound semiconductor material may include, without limitation, SiGa, SiIn, SiTl, GaIn, GaTl, or InTl. III-V group compound semiconductor material may include, without limitation, GaN, InGaN, AlN, AlP, AlAs, GaP, GaAs, InN, InP, InAs, AlGaN, AlGaP, AlGaAs, InGaN, InGaP, InGaAs, InAlN, InAlP, InAlAs, AlGaInN, AlGaInP, or AlGaInAs. II-VI group semiconductor material may include, without limitation, ZnO, ZnS, CdO, CdS, CdZnO, CdZnS, MgZnO, MgZnS, CdMgZnO, or CdMgZnS. I-VII group compound semiconductor material may include, without limitation, CuF, CuCl, CuBr, CuI, AgF, AgCl, AgBr, AgI, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuFClBr, CuFClI, CuFBrI, CuIBrCl, AgFClBr, AgFClI, AgFBrI, AgClBrI, AuFClBr, AuFClI, AuFBrI, or AuClBrI. A band gap of active layer 110 may be smaller than a band gap of barrier layer 120, which will be further described hereinafter.

In some embodiments, active layer 110 and barrier layer 120 may be composed of the same semiconductor material. When active layer 110 and barrier layer 120 are composed of the same semiconductor material, for example, GaAs, the structure of active layer 110 and barrier layer 120 can be referred to as a homostructure.

In other embodiments, active layer 110 can be composed of a semiconductor material different from those of barrier layer 120. When active layer 110 and barrier layer 120 are composed of different semiconductor materials (for example, when active layer 110 is composed of GaAs, and barrier layer 120 is composed of AlGaAs), the structure of active layer 110 and barrier layer 120 can be referred to as a heterostructure.

Surface plasmon metal layer 140 may have a thickness of several nanometers to several micrometers, for example, about 0.3 nm to 30 μm, about 3 nm to 15 μm, or about 10 nm to 500 nm. Surface plasmon metal layer 140 may include, without limitation, Au, Ag, Cu, Ti, Cr, or an alloy thereof.

Figure 2:
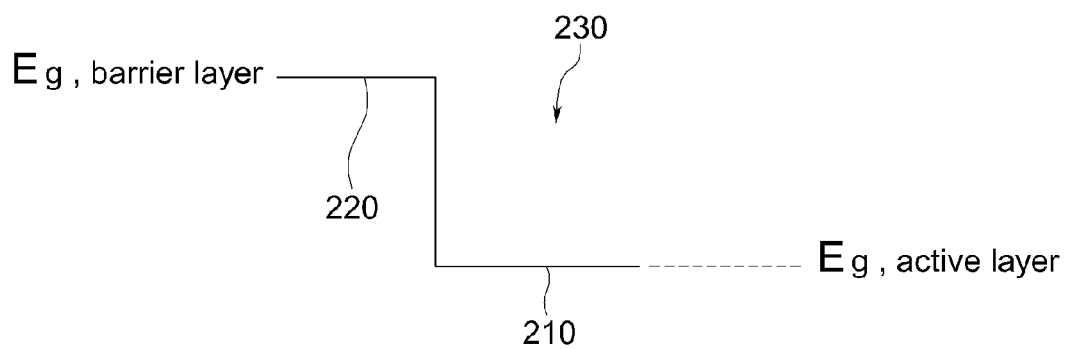
FIG. 2 is a schematic diagram showing band gaps of the semiconductor device of FIG. 1.

FIG. 2 is a schematic diagram showing band gaps of the semiconductor device of FIG. 1. In some embodiments, barrier layer 120 has a band gap which is larger than that of active layer 110. By way of example, as depicted in FIG. 2, a band gap (Eg, active layer) 210 of active layer 110 is smaller than a band gap (Eg, barrier layer) 220 of barrier layer 120. Eg, active layer 210 refers to the difference between Ec and Ev at active layer 110, and Eg, barrier layer 220 refers to the difference between Ec and Ev at barrier layer 120. Ec is an energy level at a conduction band of a semiconductor material, and Ev is an energy level at a valence band of a semiconductor material.

Due to the energy level difference between Eg, active layer 210 and Eg, barrier layer 220, a potential well 230 is formed in active layer 110. Potential well 230 can confine carriers (for example, excess electrons and holes) diffused from barrier layer 120. This potential well 230 is also referred to as a "quantum well." In an equilibrium state where no charge is supplied to barrier layer 120, the carriers (for example, excess electrons and holes) are confined in barrier layer 120 by a potential barrier formed across the junction between barrier layer 120 and active layer 110. When charges are supplied to barrier layer 120, the potential barrier is reduced and the carriers are able to be diffused into quantum well 230 in active layer 110 across the junctions. Once the carriers are diffused into quantum well 230, they are confined in quantum well 230 due to the band gap difference between Eg, active layer 210, and Eg, barrier layer 220, as illustrated above. Then, the recombination of excess electrons and holes can occur in active layer 110. This allows more carriers to move into quantum well 230 to replace the electrons and holes that have been recombined. An energy is released as the excess electrons and the excess holes are recombined in quantum well 230. The energy can be emitted from quantum well 230 as photons.

Quantum efficiency is a quantity defined as the percentage of photons that produces an electron-hole pair, and is represented by Equation (1) below.

$$R = 2\pi / \hbar \langle d \rangle^2 \rho(\hbar \omega)$$ Equation (1)

where $\hbar$ is the Plank constant divided by $2\pi$, $\langle d \rangle$ is the dipole matrix, and $\rho(\hbar \omega)$ is the photon density of states at the given angular frequency $\omega$. It can be understood from Equation (1) that the quantum efficiency for semiconductor device 100 can be improved by controlling the photon density $\rho(\hbar \omega)$ and/or controlling the dipole matrix element $\langle d \rangle$ of semiconductor device 100. The photon density can be increased by enhancing the amount of an optical field existing in active layer 110. The dipole matrix element can be increased by preventing a non-uniform current spreading in active layer 110 and compensating an internal polarization field existing in active layer 110.

As depicted in FIG. 1, surface plasmon metal layer 140 is disposed on a lateral surface of light emitting layer 130. Accordingly, surface plasmon metal layer 140 is in contact with active layer 110 and barrier layer 120 of light emitting layer 130. Electrons, located at an interface between light emitting layer 130 and surface plasmon metal layer 140, are collectively oscillated, and thus a density of the electrons is fluctuated. This collective oscillation of the electrons is referred to as surface plasmon resonance. The surface plasmon resonance makes surface plasmon metal layer 140 have a large absolute value of permittivity. By way of example, if surface plasmon metal layer 140 is composed of Au, an absolute value of permittivity of surface plasmon metal layer 140 may be about 100 to 200. This absolute value of permittivity is greater than that of light emitting layer 130. By way of example, if active layer 110 is composed of GaN, the absolute value of permittivity of light emitting layer 130 is about 10.

Since electric flux densities in light emitting layer 130 and surface plasmon metal layer 140 are the same, and electric flux densities are represented as a multiplication of permittivity and optical field intensity, the following Equation (2) can be derived.

$$\frac{D_{emitting}}{D_{metal}} = \frac{\varepsilon_{emitting} \cdot E_{emitting}}{\varepsilon_{metal} \cdot E_{metal}} = 1$$ Equation (2)

where $D_{emitting}$ and $D_{metal}$ respectively refer to electric flux densities of light emitting layer 130 and surface plasmon metal layer 140, $\varepsilon_{emitting}$ and $\varepsilon_{metal}$ respectively refer to permittivities of light emitting layer 130 and surface plasmon metal layer 140, and $E_{emitting}$ and $E_{metal}$ respectively refer to optical field intensities of light emitting layer 130 and surface plasmon metal layer 140. The following Equation (3) is derived from Equation (2) above.

$$\frac{E_{emitting}}{E_{metal}} = \frac{\varepsilon_{metal}}{\varepsilon_{emitting}}$$ Equation (3)

Since the permittivity $\varepsilon_{metal}$ of surface plasmon metal layer 140 is greater than the permittivity $\varepsilon_{emitting}$ of light emitting layer 130 in absolute value as described above, the optical field intensity $E_{emitting}$ of light emitting layer 130 is greater than the optical field intensity $E_{metal}$ of surface plasmon metal layer 140. Thus, an optical field generated in light emitting layer 130 can be mostly distributed in active layer 110 of light emitting layer 130 by contacting surface plasmon metal layer 140 with light emitting layer 130.

Figure 3:
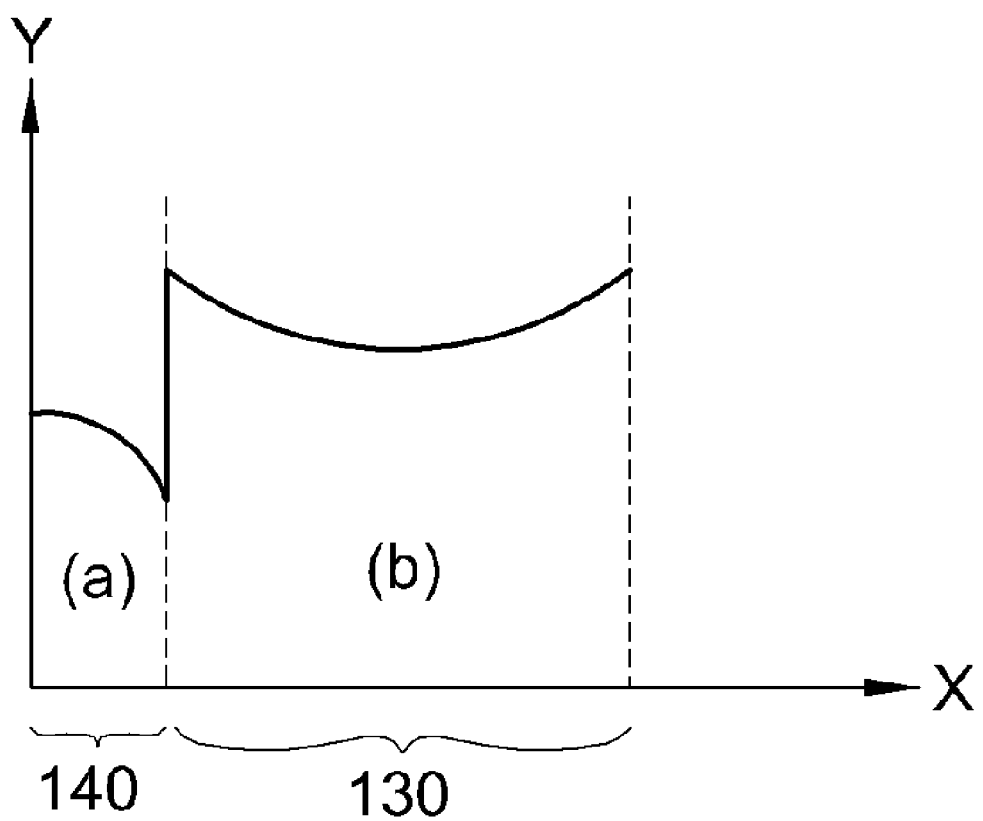
FIG. 3 is a graph showing a distribution of optical field in the semiconductor device of FIG. 1.

FIG. 3 is a graph showing a distribution of the optical field in light emitting layer 130 and surface plasmon metal layer 140. The y-axis of the graph represents the amounts of the optical field distributed in surface plasmon metal layer 140 and light emitting layer 130. The x-axis of the graph represents the cross-sectional arrangements of surface plasmon metal layer 140 and light emitting layer 130, as depicted in FIG. 1. An (a) region indicates the amount of the optical field distributed in surface plasmon metal layer 140. A (b) region indicates the amount of the optical field distributed in light emitting layer 130. As illustrated above, when charges are supplied to barrier layer 120 of light emitting layer 130, the carriers (for example, excess electrons and holes) are diffused into the quantum well formed in active layer 110 of light emitting layer 130, rather than into surface plasmon metal layer 140, because the permittivity of surface plasmon metal layer 140 is greater than that of light emitting layer 130 having active layer 110. Then, the recombination of excess electrons and holes occurs in active layer 110 and emits photons, generating an optical field in active layer 110. Thus, as illustrated in the graph of FIG. 3, the optical field is mostly distributed in active layer 110 of light emitting layer 130. Accordingly, a quantum efficiency of semiconductor device 100 can be improved due to the increased amount of the optical field in active layer 110 of light emitting layer 130.

FIG. 4 is a schematic diagram of another illustrative embodiment of a semiconductor device. As depicted in FIG. 4, a semiconductor device 400 includes a light emitting layer 435, a first surface plasmon metal layer 440, a second surface plasmon metal layer 442, and a gate electrode 450. Light emitting layer 435 may include an active layer 410, a first barrier layer 420, and a second barrier layer 430. Light emitting layer 435 is different from light emitting layer 130 of FIG. 1 in that light emitting layer 435 has second barrier layer 430 disposed on an upper surface of active layer 410. Suitable materials and thickness for active layer 410, first and second barrier layers 420 and 430 are substantially the same as the materials and thickness described above for active layer 110 and barrier layer 120.

Semiconductor device 400 includes a first surface plasmon metal layer 440 on a lateral surface (for example, a left lateral surface) and a second surface plasmon metal layer 442 on an opposite lateral surface (for example, a right lateral surface) of light emitting layer 435. Suitable materials and thickness for first and second surface plasmon metal layers 440 and 442 are substantially the same as the materials and thickness described above for surface plasmon metal layer 140.

Further, semiconductor device 400 includes a gate electrode 450 on one surface of light emitting layer 435. FIG. 4 illustrates that gate electrode 450 is disposed on a portion of an upper surface of second barrier layer 430. In another embodiment, gate electrode 450 may be disposed on a portion of a bottom surface of first barrier layer 420. In still another embodiment, gate electrode 450 may be entirely disposed on the upper surface of second barrier layer 430 or the bottom surface of first barrier layer 420. Gate electrode 450 may have a thickness of several nanometers to several micrometers, for example, about 0.1 nm to 5 µm, about 1 nm to 3 µm, or about 5 nm to 500 nm. Gate electrode 450 may be composed of a transparent conductive material. The transparent conductive material can transmit an incident light and provide an electric connectivity to gate electrode 450. The transparent conductive material may include, without limitation, indium-tin oxide (ITO), tin oxide, zinc oxide, or organic transparent electrode, such as carbon nanotubes.

In some embodiments, gate electrode 450 may be connected to an external device (for example, a power supply) (not shown). Gate electrode 450 applies an electric field (hereinafter, referred to as a "gate field") provided from the external device to active layer 410. The gate field can compensate or cancel out internal polarization field existing in active layer 410. Herein, the internal polarization field refers to the field which arises from a spontaneous polarization and a piezoelectric polarization in active layer 410. The spontaneous polarization refers to polarization that arises in ferroelectrics without an external electric field. The piezoelectric polarization refers to polarization that arises from an electric potential generated in response to an applied mechanical stress, such as strain of a layer. The internal polarization field degrades the quantum efficiency of semiconductor device 400 by weakening the excitonic binding of the carriers (for example, excess electrons and holes). For additional details on the spontaneous and piezoelectric polarizations and the internal polarization field, see Ahn et al., "Spontaneous and piezoelectric polarization effects in wurtzite ZnO/MgZnO quantum well lasers," Appl. Phys. Lett. Vol. 87, p. 253509 (2005), which is incorporated by reference herein in its entirety. In this embodiment, gate electrode 450 applies the gate field to light emitting layer 435. The applied gate field can compensate or cancel out the internal polarization field in active layer 410.

FIG. 5 is a schematic diagram of still another illustrative embodiment of a semiconductor device. A semiconductor device 500 includes a light emitting layer 535 having an active layer 510 and first and second barrier layers 520 and 530 respectively disposed on bottom and upper surfaces of active layer 510, a first surface plasmon metal layer 540 disposed on one lateral surface (for example, a left lateral surface) of light emitting layer 535, and a second surface plasmon metal layer 542 disposed on an opposite lateral surface (a right lateral surface) of light emitting layer 535. Light emitting layer 535 and first and second surface plasmon metal layers 540 and 542 are substantially the same as light emitting layer 435 and first and second surface plasmon metal layers 440 and 442. Thus, redundant descriptions thereof will be omitted herein for the simplicity of description.

Semiconductor device 500 includes a doped layer to provide impurities to active layer 510 of light emitting layer 535. In one embodiment, semiconductor device 500 may include a first doped layer 525. First doped layer 525 includes a first portion 525-1 disposed under both light emitting layer 535 and first and second surface plasmon metal layers 540 and 542, and a second portion 525-2 horizontally extended from first portion 525-1. In another embodiment, semiconductor device 500 may further include a second doped layer 526 disposed on second barrier layer 530 of light emitting layer 535, while being between first and second surface plasmon metal layers 540 and 542. In still another embodiment, semiconductor device 500 may still further include a third doped layer 527 under both light emitting layer 535 and first and second surface plasmon metal layers 540 and 542 such that third doped layer 527 can be interposed between first doped layer 525 and light emitting layer 535 and first and second surface plasmon metal layers to provide an insulation between first doped layer 525, and first and second surface plasmon metal layers 540 and 542.

First and second doped layers 525 and 526 may be doped with dopants to add impurity elements to crystal lattices of semiconductor materials in active layer 510 and first and second barrier layers 520 and 530. In some embodiments, first doped layer 525 may be doped with n-type dopants, and second doped layer 526 may be doped with p-type dopants. The n-type dopants may include, without limitation, at least one element from a V group of the periodic table, for example, N, P, As, and Sb. A layer doped with the n-type dopants has an abundance of electrons, referred to as excess electrons. The p-type dopants may include, without limitation, at least one element from a III group of the periodic table, for example, B, Al, Ga, and In. A layer doped with the p-type dopants has an abundance of holes, referred to as excess holes.

As depicted in FIG. 5, first doped layer 525 includes a first portion 525-1 on which third doped layer 527 is disposed and a second portion 525-2 on which a first electrode 522 (which will be described later) is partially disposed. Second portion 525-2 can have a width sufficient to dispose first electrode 522 thereon. By way of example, second portion 525-2 can have a width of about 1 nm to 500 nm, about 10 nm to 300 nm, or about 50 nm to 100 nm. A width of light emitting layer 535 ranges from several nanometers to several hundreds nanometers. By way of example, the width of light emitting layer 535 can be about 1 nm to 300 nm, about 10 nm to 100 nm, or about 30 nm to 50 nm.

Semiconductor device 500 includes first electrode 522 in contact with first doped layer 525, and a second electrode 532 in contact with second doped layer 526. By way of example, first electrode 522 may be partially disposed on one surface (for example, an upper surface) of second portion 525-2 of first doped layer 525, and second electrode 532 may be disposed on an upper surface of second doped layer 526. First and second electrodes 522 and 532 supplies charges to first and second doped layers 525 and 526, respectively. The excess electrons and holes in first and second doped layers 525 and 526 can be excited in response to the supplied charges. Each of first and second electrodes 522 and 532 may have a thickness of several nanometers to several micrometers. By way of example, the thickness of each of first and second electrodes 522 and 532 may be about 0.1 nm to 10 µm, about 1 nm to 5 µm, or about 3 nm to 500 nm. Each of first and second electrodes 522 and 532 may be composed of Al, Ti, Ni, Au, Ti/Al, Ni/Au, Ti/Al/Ti/Au, or an alloy thereof, without limitation.

Further, semiconductor device 500 includes a substrate 560, and a buffer layer 555 disposed on substrate 560. FIG. 5 illustrates buffer layer 555 disposed on a bottom surface of first doped layer 525, and substrate 560 disposed on a bottom surface of buffer layer 555. Buffer layer 555 may be made of the IV group semiconductor material, IV-IV, III-V, or II-VI group compound semiconductor material. The material for buffer layer 555 is not limited to aforementioned groups, but may also include any material that establishes good structural quality. Buffer layer 555 may have a thickness of several nanometers to several hundred micrometers, for example, about 1 nm to 300 µm. Substrate 560 may include, without limitation, silicon (Si), silicon nitride (SiN), silicon carbide (SiC), spinel (MgAl2O4), aluminum nitride (AlN), gallium nitride (GaN), or aluminum gallium nitride (AlGaN). Substrate 560 may have a thickness of several nanometers to several hundred micrometers, for example, about 1 nm to 500 µm, about 3 nm to 300 µm, or about 5 nm to 50 µm.

In some embodiments, semiconductor device 500 includes a gate electrode 550 disposed on a portion of an upper surface of second doped layer 526 while being spaced from second electrode 532 by several nanometers to several hundreds nanometers, for example, 1 nm to 300 nm, about 10 nm to 50 nm, or about 20 nm to 30 nm. Suitable materials and thickness for gate electrode 550 are substantially the same as the materials and thickness described above for gate electrode 450.

As depicted in FIG. 5, since first and second surface plasmon metal layers 540 and 542 are in contact with light emitting layer 535, the optical field generated in active layer 510 is not leaked out from active layer 510, and thus quantum efficiency of semiconductor device 500 is improved. In addition, the gate field applied to light emitting layer 535 by gate electrode 550 can compensate or cancel out the internal polarization field in active layer 510, and thus, the quantum efficiency of semiconductor device 500 can be further enhanced.

Figure 6:
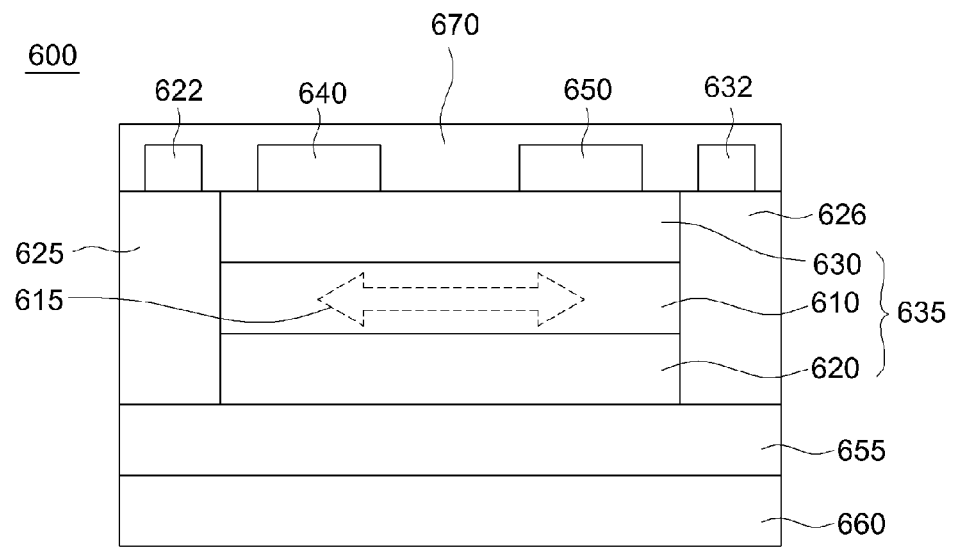
FIG. 6 is a schematic diagram of still another illustrative embodiment of a semiconductor device.

FIG. 6 is a schematic diagram of another illustrative embodiment of a semiconductor device. A semiconductor device 600 includes a light emitting layer 635 having an active layer 610 and first and second barrier layers 620 and 630 respectively disposed on bottom and upper surfaces of active layer 610. Suitable materials and thickness for active layer 610 and first and second barrier layers 620 and 630 are substantially the same as the materials and thickness described above for active layer 110, and barrier layer 120, respectively. A surface plasmon metal layer 640 is disposed on a portion of an upper surface of second barrier layer 630 of light emitting layer 635. Surface plasmon metal layer 640 has a thickness of about 0.1 nm to 10 µm, about 1 nm to 5 µm, or about 5 nm to 500 nm. Suitable materials for surface plasmon metal layer 640 are substantially the same as the materials described above for surface plasmon metal layer 140.

Semiconductor device 600 further includes a first doped layer 625 and a second doped layer 626. By way of example, first doped layer 625 may be disposed on one lateral surface (for example, a left lateral surface) of light emitting layer 635, and second doped layer 626 may be disposed on the other lateral surface (for example, a right lateral surface) of light emitting layer 635. In some embodiments, first doped layer 625 may be doped with n-type dopants, and second doped layer 626 may be doped with p-type dopants. Suitable dopants for first and second doped layers 625 and 626 are substantially the same as the dopants described above for dopants for first and second doped layers 525 and 526, respectively.

Since first and second doped layers 625 and 626 are disposed on the lateral surfaces of light emitting layer 630, as depicted in FIG. 6, the carriers from first and second doped layers 625 and 626 can be laterally injected to active layer 610, and thus, a current can laterally flow in a straight path 615 through active layer 610. The lateral carrier injection of semiconductor device 600 prevents non-uniform current spreading. Herein, the non-uniform current spreading refers to a phenomenon that occurs when a current path is bent and a current is crowded in a certain point of the bent current path. The non-uniform current spreading can lead to a localized overheating and formation of thermal hot spots, which degrades the performance of a semiconductor device. However, since semiconductor device 600 has a straight current path from second doped layer 626 to first doped layer 625, or from first doped layer 625 to second doped layer 626, it does not undergo such a non-uniform current spreading, thereby increasing the dipole matrix element as illustrated with reference to Equation (1) above. For additional details on the non-uniform current spreading and lateral current injection, see D. Ahn et al., "A field-effect quantum-well laser with lateral current injection," Appl. Phys., Vol. 64 (1), p. 440 (July 1988), Seong-Ran Jeon et al., "GaN tunnel junction as a current aperture in a blue surface-emitting light-emitting diode," Appl. Phys. Lett., Vol. 80 (11), p. 1933 (March 2002), and Hyunsoo Kim et al., "Lateral current transport path, a model for GaN-based light-emitting diodes: Applications to practical device designs," Appl. Phys. Lett., Vol. 81 (7), p. 1326 (August 2002), which are incorporated by reference herein in their entireties.

Semiconductor device 600 further includes a first electrode 622 and a second electrode 632 in electrically contact with first and second doped layers 625 and 626, respectively. By way of example, first electrode 622 may be disposed on a portion of an upper surface of first doped layer 625, and second electrode 632 may be disposed on a portion of an upper surface of second doped layer 626. Suitable materials and thickness for first and second electrodes 622 and 632 are substantially the same as the materials and thickness described above for first and second electrodes 522 and 532.

Semiconductor device 600 further includes a gate electrode 650 disposed on a portion of the upper surface of light emitting layer 635 such that gate electrode 650 is spaced from surface plasmon metal layer 640. Suitable materials and thickness for gate electrode 650 are substantially the same as the materials and thickness described above for gate electrode 450. The gap size between surface plasmon metal layer 640 and gate electrode 650 may be several nanometers to several micrometers, for example, about 10 nm to 10 µm, about 50 nm to 300 nm, or about 100 nm to 200 nm.

Semiconductor device 600 further includes an insulating layer 670 to cover the upper surfaces of light emitting layer 635, and first and second doped layers 625 and 626 and to be disposed on the gaps between first electrode 622 and surface plasmon metal layer 640, surface plasmon metal layer 640 and gate electrode 650, and gate electrode 650 and second electrode 632. Thus, an electrical contact between first electrode 622, surface plasmon metal layer 640, gate electrode 650 and second electrode 632 can be prevented. Insulating layer 670 may be composed of any material that provides electric insulation. By way of example, the materials for insulating layer 670 may include, without limitation, silicon oxide, or silicon nitride. Insulating layer 670 may have a thickness of several nanometers to several micrometers, for example, about 0.1 nm to 100 μm, about 1 nm to 50 μm, or about 3 nm to 500 nm.

Semiconductor device 600 further includes a buffer layer 655 and a substrate 660. As depicted in FIG. 6, buffer layer 655 may be disposed to cover the bottom surfaces of light emitting layer 635 and first and second doped layers 625 and 626, and substrate 660 may be disposed on a bottom surface of buffer layer 655. Suitable materials and thicknesses for buffer layer 655 and substrate 660 are substantially the same as the materials and thickness as described above for buffer layer 555 and substrate 560.

Figure 7:
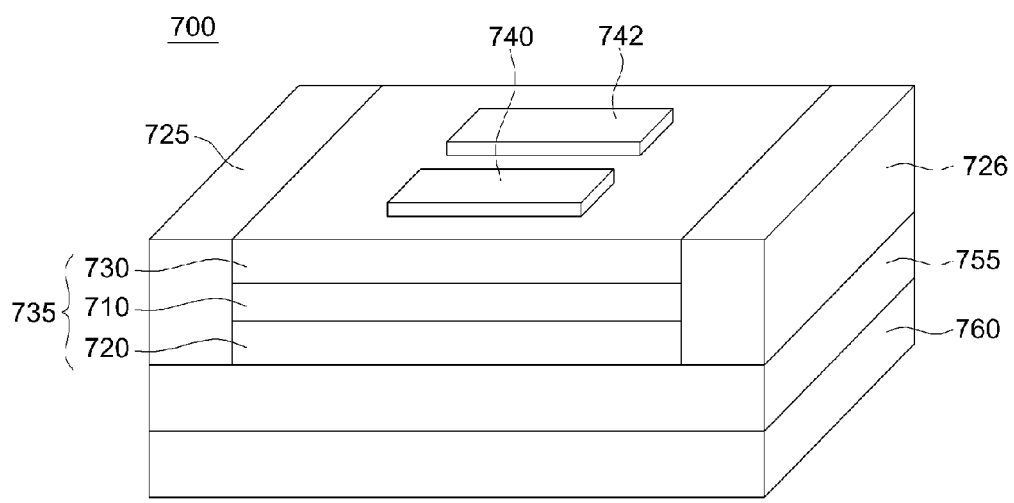
FIG. 7 is a schematic diagram of still another illustrative embodiment of a semiconductor device.

FIG. 7 is a schematic diagram of another illustrative embodiment of a semiconductor device. A semiconductor device 700 includes a light emitting layer 735, and a first surface plasmon metal layer 740. Light emitting layer 735 includes an active layer 710, a first barrier layer 720, and a second barrier layer 730. Semiconductor layer 700 further includes a first doped layer 725, a second doped layer 726, a buffer layer 755, and a substrate 760. Suitable materials, thickness, and dispositions for the above elements of semiconductor device 700 are substantially the same as those of semiconductor device 600. As depicted in FIG. 7, semiconductor device 700 further includes a second surface plasmon metal layer 742 disposed on a portion of an upper surface of light emitting layer 735. By way of example, first and second surface plasmon metal layers 740 and 742 may be formed on the upper surface of light emitting layer 735 in serial (as depicted in FIG. 7) or in parallel in the longitudinal direction of light emitting layer 735, while being spaced by several nanometers to several hundreds micrometers, for example, 1 nm to 10 μm, about 10 nm to 5 μm, or about 30 nm to 500 nm. Suitable materials and thickness for first and second surface plasmon metal layers 740 and 742 are substantially the same as the materials and thickness described above for surface plasmon metal layer 140. The number of surface plasmon metal layers is not limited to the illustrated example. Semiconductor device 700 may have a multiple number of surface plasmon metal layers in contact with light emitting layer 735.

Although the present invention is described with respect to FIGS. 1 and 4-7, it will be apparent to those skilled in the art that the present invention is not limited to those illustrated examples. By way of example, it will be apparent that the number and dispositions of a surface plasmon metal layer, a doped layer, and an electrode are not limited the illustrated examples, and the doped layer, the electrode, a buffer layer, and a substrate are optional so that any of them can be omitted without limitation.

Figure 8A:
FIGS. 8(a)-8(c) are top views showing illustrative embodiments of a semiconductor device including active layers and barrier layers.
Figure 8B:
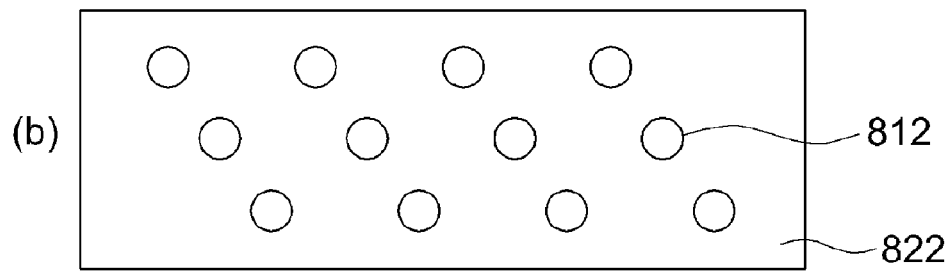
Figure 8C:
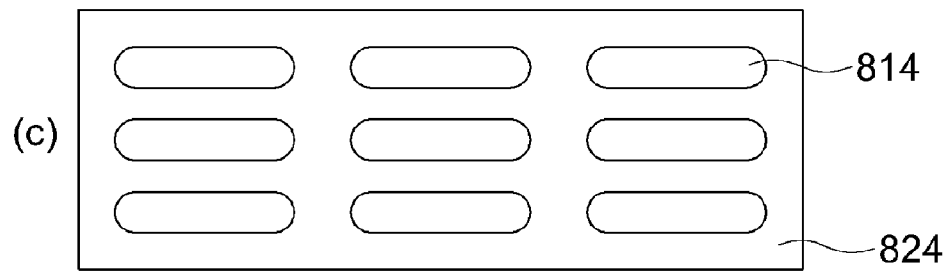

FIGS. 8(a)-8(c) are top views showing illustrative embodiments of a semiconductor device including active layers and barrier layers.

As depicted in FIGS. 8(a)-8(c), the active layers, as described with reference to FIGS. 1, 4, 5, 6, and 7, may be aligned in the form of nano-structures, such as quantum wires, quantum dots, or nanorods. By way of example, as illustrated in FIG. 8(a), active layers 810 may be aligned in the form of quantum wires. A quantum wire refers to an electrically conducting semiconductor wire whose excitons are confined in one spatial dimension. A barrier layer 820 surrounds active layers 810. For another example, as illustrated in FIG. 8(b), active layers 812 may be aligned in the form of quantum dots. Here, a barrier layer 822 surrounds active layers 812. A quantum dot refers to a semiconductor structure whose excitons are confined in all three spatial dimensions. For still another example, as illustrated in FIG. 8(c), active layers 814 may be aligned in the form of nanorods, and a barrier layer 824 surrounds active layer 814. A nanorod refers to a nano-scale semiconductor structure which is in the form of a rod. The numbers of the quantum wires, quantum dots, and nanorods are not limited to those shown in FIGS. 8(a)-8(c). In other embodiments, active layers may be aligned as any combination of at least one quantum wire, at least one quantum dot, and at least one nanorod.

Figure 9A:
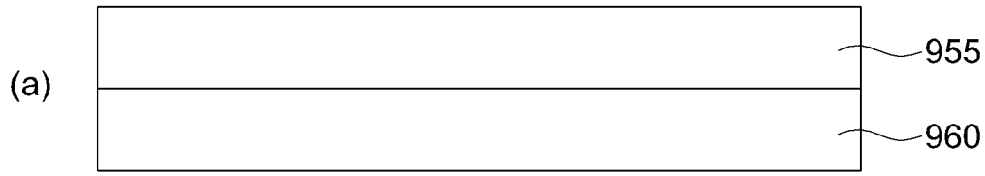
FIGS. 9(a)-9(f) are schematic diagrams illustrating an illustrative embodiment of a method for fabricating a semiconductor device.
Figure 9B:
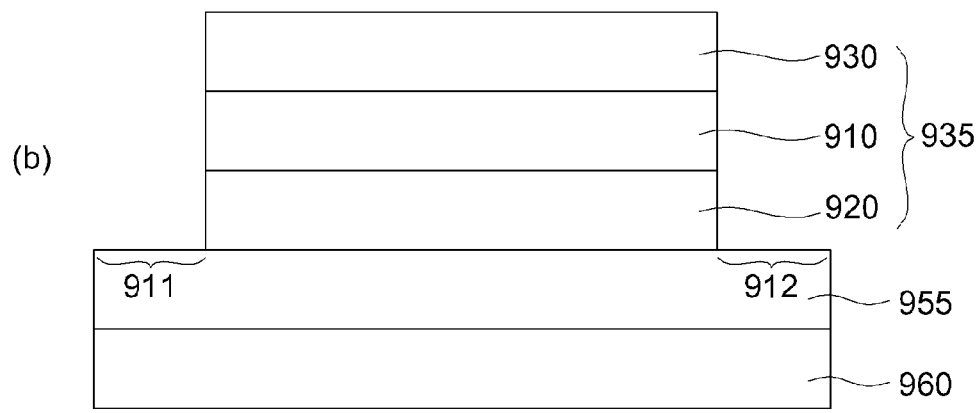
Figure 9C:
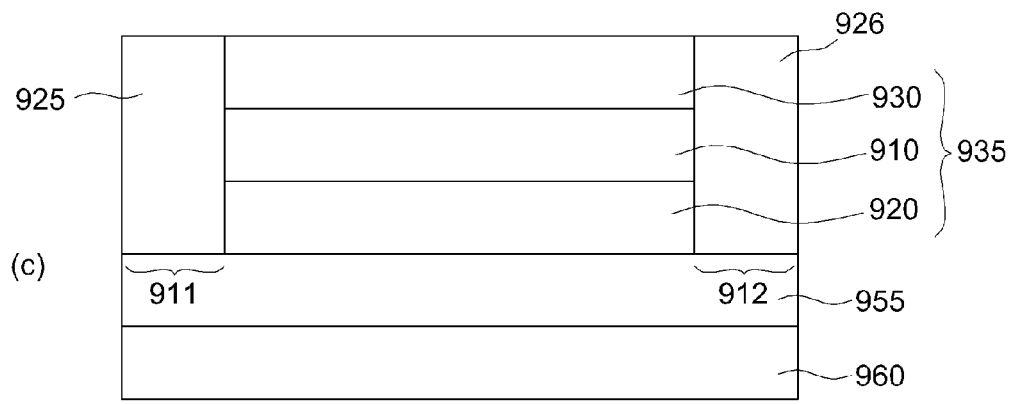
Figure 9D:
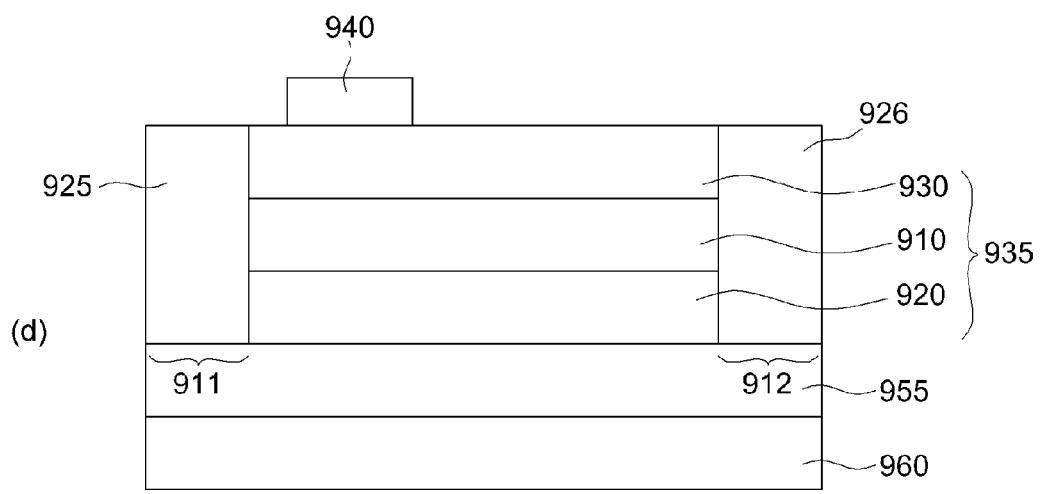
Figure 9E:
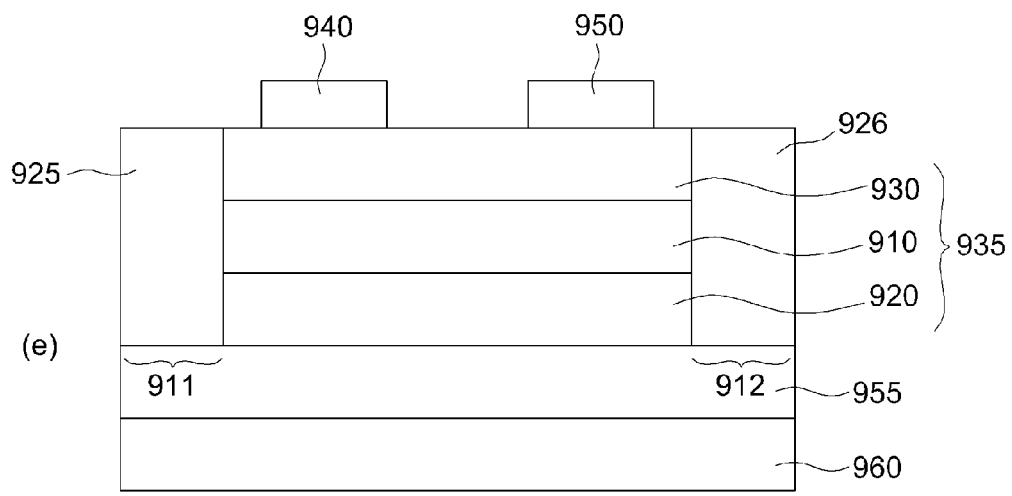
Figure 9F:
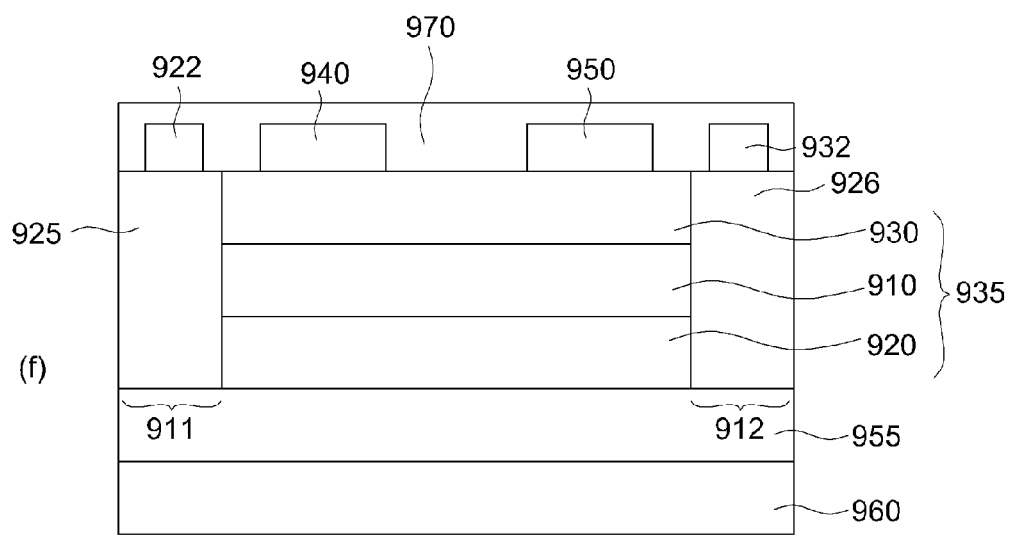
Figure 10:
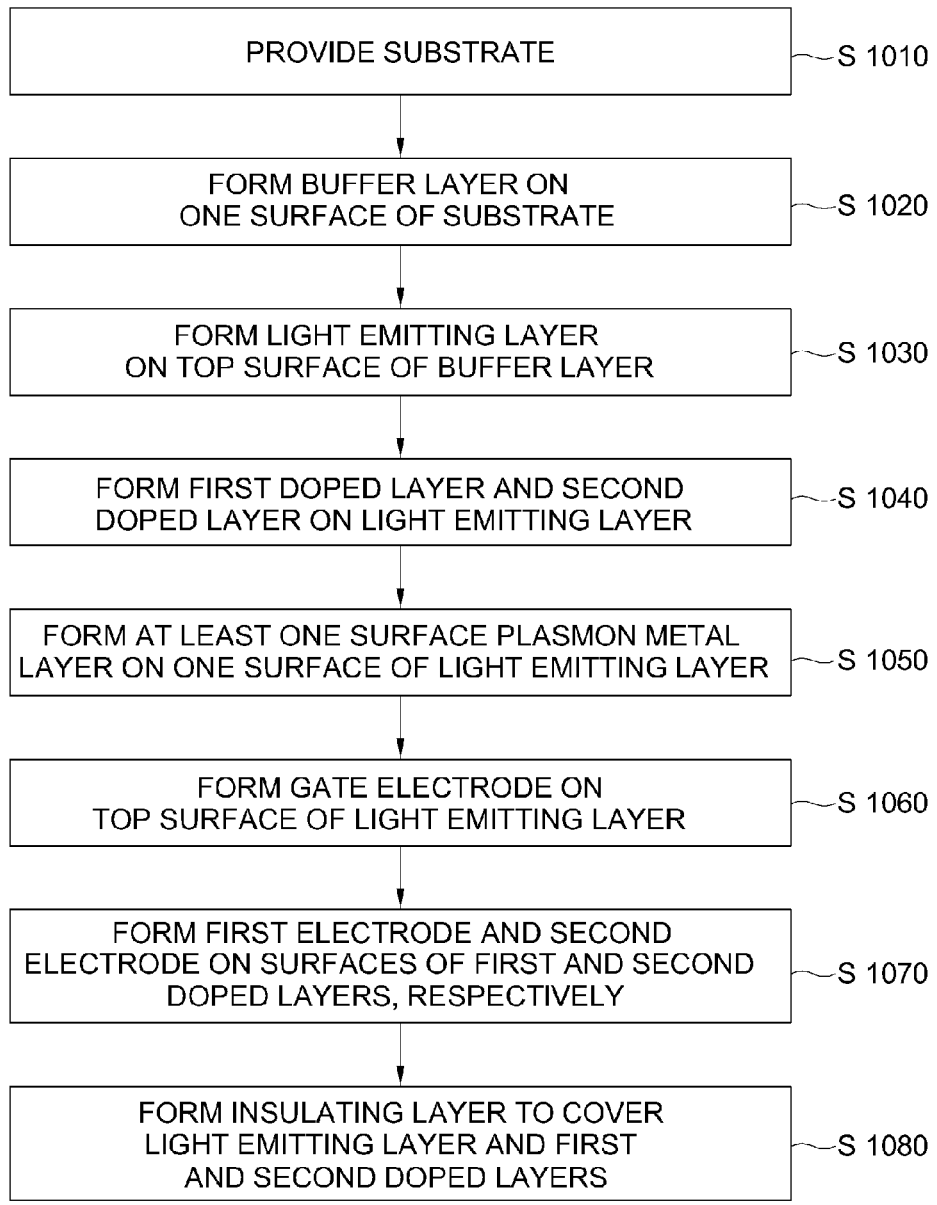
FIG. 10 is a flow chart illustrating the method.

FIGS. 9(a)-9(f) are schematic diagrams illustrating an illustrative embodiment of a method for fabricating a semiconductor device 900. FIG. 10 is a flow chart illustrating the method.

A substrate 960 is provided (S 1010). Then, a buffer layer 955 may be formed on one surface (for example, an upper surface) of substrate 960 (S 1020). Buffer layer 955 may be formed on the surface of substrate 960 using any of a variety of well-known deposition techniques or epitaxy techniques, such as radio-frequency (RF) magnetron sputtering, pulsed laser deposition, metal organic chemical vapor deposition (MOCVD), molecular beam epitaxy, and radio-frequency plasma-excited molecular beam epitaxy. Suitable materials and thickness for substrate 960 and buffer layer 955 are substantially the same as the materials and thickness described above for substrate 560 and buffer layer 555, respectively.

A light emitting layer 935 may be formed on one surface of buffer layer 955 (S 1030). Light emitting layer 935 may be formed by forming a first barrier layer 920 on an upper surface of buffer layer 955, forming an active layer 910 on an upper surface of first barrier layer 920, and forming a second barrier layer 930 on an upper surface of active layer 910. First barrier layer 930, active layer 940, and second barrier layer 950 constitute light emitting layer 935. First barrier layer 920, active layer 910, and second barrier layer 930 may be formed using the aforementioned deposition techniques or epitaxy techniques. Suitable materials and thickness for first barrier layer 920, active layer 910, and second barrier layer 930 are substantially the same as the materials and thickness described above for first barrier layer 520, active layer 510, and second barrier layer 530, respectively. Then, both end portions of light emitting layer 935 are etched using any of variety of etching techniques, such as dry etching, wet etching, or plasma etching. As a result of the etching, exposed portions 911 and 912 are formed on both ends of the upper surface of buffer layer 955.

A first doped layer 925 and a second doped layer 926 may be formed on surfaces (for example, left and right lateral surfaces) of light emitting layer 935 (S 1040). In some embodiments, undoped semiconductor layers (not shown) may be formed on exposed portions 911 and 912 of the upper surface of buffer layer 955 using the aforementioned deposition and epitaxy techniques. Then, N-type dopants and p-type dopants may be injected to the undoped semiconductor layers to form first and second doped layers 925 and 926, respectively. In this case, first doped layer 925 is n-type doped layer, and second doped layer 927 is p-type doped layer. Suitable materials and thickness for first and second doped layers 925 and 926 are substantially the same as the materials and thickness described above for first and second doped layers 525 and 526.

At least one surface plasmon metal layer 940 may be formed on one surface (for example, an upper surface) of light emitting layer 935 (S 1050). In some embodiments, surface plasmon metal layer 940 may be formed on any surfaces (for example, a bottom surface or a left or right lateral surface) of light emitting layer 935. In other embodiments, a multiple number of surface plasmon metal layers can be formed on light emitting layer 935. Particularly, surface plasmon metal layer 940 may be formed by depositing a metallic material (for example, Au, Ag, Cu, or an alloy thereof) in which surface plasmon may occur and by etching both ends of the deposited metallic material as shown in FIG. 9(d). The deposition of the metallic material can be performed by any of a variety of well-known metal deposition techniques, such as sputtering, electroplating, e-beam evaporation, thermal evaporation, laser-induced evaporation, and ion-beam induced evaporation. The etching of the ends of the deposited metallic material may be performed by any of a variety of well-known metal etching and lithography techniques, such as wet etching, dry etching, plasma etching, reactive ion etching, focused ion-beam lithography, e-beam lithography, proximal prove patterning, X-ray lithography, or extreme-UV lithography. Suitable metal materials and thickness for surface plasmon metal layer 940 are substantially the same as the materials and thickness described above for surface plasmon metal layer 140.

A gate electrode 950 may be formed on an upper surface of light emitting layer 935 (S 1060). In an embodiment where surface plasmon metal layer 940 and gate electrode 950 are formed on the same surface (for example, an upper surface) of light emitting layer 935, as depicted in FIG. 9(e), gate electrode 950 is spaced from surface plasmon metal layer 940 to avoid being electrically connected with surface plasmon metal layer 940. Gate electrode 950 may be formed using any of a variety of well-known deposition techniques and lithography techniques. By way of example, a base material for gate electrode 950 may be deposited using, for example, chemical vapor deposition (CVD), magnetron sputtering, or reactive evaporation. Then, the base material may be etched to form gate electrode 950 using, for example, wet etching, dry etching, plasma etching, reactive ion etching, focused ion-beam lithography, e-beam lithography, proximal prove patterning, X-ray lithography, or extreme-UV lithography. Suitable materials and thickness for gate electrode 950 are substantially the same as the materials and thickness described above for gate electrode 450.

A first electrode 922 and a second electrode 932 may be formed on surfaces (for example, upper surfaces) of first and second doped layers 925 and 926, respectively (S 1070). Any of the aforementioned well-known metal deposition techniques and etching and lithography techniques can be used to form first and second electrodes 922 and 932. Suitable materials and thickness for first and second electrodes 922 and 932 are substantially the same as the materials and thickness described above for first and second electrodes 522 and 532, respectively. An insulating layer 970 may be formed to cover light emitting layer 935, and first and second doped layers 925 and 926 (S 1080). Insulating layer 970 separates surface plasmon metal layer 940, gate electrode 950, and first and second electrodes 922 and 932 to prevent them from being connected with each other. Insulating layer 970 may be formed by using any of a variety of well known deposition techniques, such as chemical vapor deposition (CVD). Suitable materials and thickness for insulating layer 970 are substantially the same as the materials and thickness described above for insulating layer 670.

In some embodiments, semiconductor devices 100, 400, 500, 600, 700, and 900 may be included in a photo-electric conversion device, an optoelectronic device, a quantized electronic device, a short-wavelength light emitter, a photo detector, a laser, or a light emitting device. By way of example, the short-wavelength light emitter may include a light emitting layer, at least one surface plasmon metal layer being in contact with a first surface (for example, an upper surface as illustrated in FIGS. 6 and 7 or a lateral surface as illustrated in FIG. 5) of the light emitting layer, an n-type doped layer disposed on a second surface (for example, a left lateral surface as illustrated in FIGS. 6 and 7 or a bottom surface as illustrated in FIG. 5) of the light emitting layer, and a p-type doped layer disposed on a third surface (for example, a right lateral surface as illustrated in FIGS. 6 and 7 or an upper surface as illustrated in FIG. 5) of the light emitting layer. The light emitting layer may include an active layer having a first band gap, and one or more barrier layers disposed on at least one surface of the active layer. The barrier layers have a second band gap which is larger than the first band gap. Further, the photo-electric conversion device, the optoelectronic device, the quantized electronic device, the photo detector, the laser, or the light emitting device may include the light emitting layer and the at least one surface plasmon metal layer in substantially similar way.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A semiconductor device comprising:
   a light emitting layer comprising an active layer having a first band gap, and one or more barrier layers disposed on at least one surface of the active layer, the barrier layers having a second band gap; and
   at least one surface plasmon metal layer in contact with the light emitting layer,
   wherein the first band gap is smaller than the second band gap,
   wherein the at least one surface plasmon metal layer is disposed on at least one lateral surface of the light emitting layer.

2. The semiconductor device of claim 1, wherein each of the active layer and the one or more barrier layers is composed of a IV group semiconductor material, a IV-IV group compound semiconductor material, a III-V group compound semiconductor material, a II-VI group compound semiconductor material, or a I-VII group compound semiconductor material.

3. The semiconductor device of claim 1, wherein permittivity of the at least one surface plasmon metal layer is greater than permittivity of the active layer and the one or more barrier layers.

4. The semiconductor device of claim 1, wherein the at least one surface plasmon metal layer comprises Au, Ag, Cu, or an alloy thereof.

5. A semiconductor device comprising:
   a light emitting layer comprising an active layer having a first band gap, and one or more barrier layers disposed on at least one surface of the active layer, the barrier layers having a second band gap;
   at least one surface plasmon metal layer in contact with the light emitting layer,
   wherein the first band gap is smaller than the second band gap;
   a first doped layer disposed on one lateral surface of the light emitting layer; and
   a second doped layer disposed on the other lateral surface of the light emitting layer,
   wherein the at least one surface plasmon metal layer is disposed on an upper surface of the light emitting layer.

6. The semiconductor device of claim 5 further comprising:
   a first electrode disposed on one surface of the first doped layer; and
   a second electrode disposed on one surface of the second doped layer.

7. The semiconductor device of claim 5 further comprising a gate electrode, disposed on the upper surface of the light emitting layer and spaced from the at least one surface plasmon metal layer, to apply an electric field to the light emitting layer in order to compensate or cancel out an internal polarization field in the light emitting layer.

8. The semiconductor device of claim 7, wherein the gate electrode is composed of a transparent conductive material.

9. The semiconductor device of claim 1,
   wherein the semiconductor device further comprises:
   a first doped layer comprising a first portion disposed under both the light emitting layer and the at least one surface plasmon metal layer and a second portion horizontally extended from the first portion; and a second doped layer disposed on an upper surface of the light emitting layer.

10. The semiconductor device of claim 9 further comprising:

a first electrode partially disposed on the second portion of the first doped layer; and a second electrode disposed on an upper surface of the second doped layer.

11. The semiconductor device of claim 5, wherein the first doped layer is n-type doped layer, and the second doped layer is p-type doped layer.

12. The semiconductor device of claim 1, wherein the active layer comprises at least one of a quantum wire, a quantum dot, and a nanorod.

13. A short-wavelength light-emitter comprising:

a light emitting layer comprising an active layer having a first band gap, and one or more barrier layers disposed on at least one surface of the active layer, the barrier layers having a second band gap;

at least one surface plasmon metal layer in contact with a first surface of the light emitting layer;

an n-type doped layer disposed on a second surface of the light emitting layer; and a p-type doped layer disposed on a third surface of the light emitting layer, wherein the first band gap is smaller than the second band gap; and wherein the second and third surfaces are opposite to each other and the first surface is between the second and third surfaces.

14. The short-wavelength light-emitter of claim 13 further comprising a gate electrode, disposed on the first surface of the light emitting layer and spaced from the at least one surface plasmon metal layer, to apply an electric field to the light emitting layer in order to compensate or cancel out internal polarization field in the light emitting layer.

15. The short-wavelength light-emitter of claim 13 wherein the first, second and third surfaces are an upper surface, one lateral surface and the other lateral surface, respectively.

16. The short-wavelength light-emitter of claim 13 wherein the first, second and third surfaces are a lateral surface, a bottom surface and an upper surface, respectively.

17. A method for fabricating a semiconductor device comprising:

forming an active layer having a first band gap on a substrate;

forming one or more barrier layers having a second band gap on at least one surface of the active layer, the active layer and the one or more barrier layers constituting a light emitting layer;

forming at least one surface plasmon metal layer in contact with the light emitting layer, forming an n-type doped layer on one lateral surface of the light emitting layer; and forming a p-type doped layer on the other lateral surface of the light emitting layer, wherein the at least one surface plasmon metal layer is disposed on an upper surface of the light emitting layer, wherein the first band gap is smaller than the second band gap.

18. The method of claim 17, wherein each of the active layer and the at least one barrier layer is composed of a IV group semiconductor material, a IV-IV group compound semiconductor material, a III-V group compound semiconductor material, a II-VI group compound semiconductor material, or a I-VII group compound semiconductor material, and wherein the at least one surface plasmon metal layer comprises Au, Ag, Cu, or an alloy thereof.

19. The method of claim 17, wherein at least one of forming the active layer and forming the at least one barrier layer comprises employing radio-frequency (RF) magnetron sputtering, pulsed laser deposition, metal organic chemical vapor deposition (MOCVD), molecular beam epitaxy, or radio-frequency plasma-excited molecular beam epitaxy.

20. The method of claim 17 further comprising:

forming a gate electrode on the upper surface of the light emitting layer such that the gate electrode is spaced from the at least one surface plasmon metal layer.

21. The method of claim 20, wherein the gate electrode is composed of a transparent conductive material.

* * * * *

UNITED STATES PATENT AND TRADEMARK OFFICE
CERTIFICATE OF CORRECTION

| | | |
|---|---|---|
| PATENT NO. | : 8,368,047 B2 | Page 1 of 2 |
| APPLICATION NO. | : 12/606880 | |
| DATED | : February 5, 2013 | |
| INVENTOR(S) | : Ahn | |

It is certified that error appears in the above-identified patent and that said Letters Patent is hereby corrected as shown below:

Title Page 2, in Item (56), under "OTHER PUBLICATIONS", in Column 1, Line 6, delete "et al" and insert -- et al., --, therefor at each occurrence throughout the Other Publications.

Title Page 2, in Item (56), under "OTHER PUBLICATIONS", in Column 1, Lines 15-16, delete "Australian Patent Office; International Search Report and Written Opinion in corresponding PCT application (PCT/KR2010/007292):" and insert -- Australian Patent Office, International Search Report and Written Opinion in corresponding PCT application (PCT/KR2010/007292), --, therefor.

Title Page 2, in Item (56), under "OTHER PUBLICATIONS", in Column 1, Line 19, delete "9783527408283 p. 595," and insert -- 9783527408283, p. 595, --, therefor.

Title Page 2, in Item (56), under "OTHER PUBLICATIONS", in Column 2, Lines 36-37, delete "AiGan/GaN" and insert -- AlGan/GaN --, therefor.

Title Page 2, in Item (56), under "OTHER PUBLICATIONS", in Column 2, Line 45, delete "reduced-desnsity-operator" and insert -- reduced-density-operator --, therefor.

Title Page 2, in Item (56), under "OTHER PUBLICATIONS", in Column 2, Line 49, delete "reduced-desnsity-operator" and insert -- reduced-density-operator --, therefor.

Title Page 2, in Item (56), under "OTHER PUBLICATIONS", in Column 2, Lines 55-56, delete "214/215 (2000) pp." and insert -- 214/215, (2000), pp. --, therefor.

Title Page 2, in Item (56), under "OTHER PUBLICATIONS", in Column 2, Line 58, delete "superlatttices" and insert -- superlattices --, therefor.

Title Page 2, in Item (56), under "OTHER PUBLICATIONS", in Column 2, Line 68, delete "2006 pp." and insert -- 2006, pp. --, therefor.

Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,368,047 B2

Title Page 2, in Item (56), under "OTHER PUBLICATIONS", in Column 2, Line 73, delete "vol. 66 (2002) pp." and insert -- vol. 66, (2002), pp. --, therefor.

Title Page 3, in Item (56), under "OTHER PUBLICATIONS", in Column 1, Line 9, delete "Photonices" and insert -- Photonics --, therefor.

Title Page 3, in Item (56), under "OTHER PUBLICATIONS", in Column 1, Line 27, delete "GaN/AlGaN" and insert -- GaN/AlGaN --, therefor.

Title Page 3, in Item (56), under "OTHER PUBLICATIONS", in Column 1, Lines 57-58, delete "Siliconfareast.com; "Lattice Constants"; http://www.siliconfareast.com/lattice_constants.htm; 2 pages;" and insert -- Siliconfareast.com, "Lattice Constants", http://www.siliconfareast.com/lattice_constants.htm, 2 pages, --, therefor.

Title Page 3, in Item (56), under "OTHER PUBLICATIONS", in Column 1, Lines 59-60, delete "Wikipedia; "Wurtzite crystal structure", http://en.wikipedia.org/wiki/Wurtzite_crystal_structure; 1 page;" and insert -- Wikipedia, "Wurtzite crystal structure", http://en.wikipedia.org/wiki/Wurtzite_crystal_structure, 1 page, --, therefor.

Title Page 3, in Item (56), under "OTHER PUBLICATIONS", in Column 1, Line 70, delete "Nanothecnology." and insert -- Nanotechnology. --, therefor.

Title Page 3, in Item (56), under "OTHER PUBLICATIONS", in Column 2, Line 64, delete "Vaccum," and insert -- Vacuum, --, therefor.

In the Specification

In Column 1, Lines 6-10, delete "This application is related to U.S. Patent application 12/498,265 filed Jul. 6, 2009 and to U.S. Patent application 12/498,257 filed Jul. 6, 2009 and to U.S. Patent application 12/498,204filed Jul. 6, 2009 and to U.S. Patent application 12/472,168 filed May 26, 2009." and insert -- This application is related to U.S. Patent application 12/498,265 filed Jul. 6, 2009, to U.S. Patent application 12/498,257 filed Jul. 6, 2009, to U.S. Patent application 12/498,204 filed Jul. 6, 2009, to U.S. Patent application 12/498,228 filed July 26, 2009, and to U.S. Patent application 12/472,168 filed May 26, 2009. --, therefor.

In Column 1, Line 49, delete "device" and insert -- device. --, therefor.